United States Patent

[11] 3,607,449

[72] Inventors Takashi Tokuyama
Hoya-shi;
Takao Miyazaki, Hachioji-shi; Takashi Tsuchimoto, Kodaira-shi; Tadahisa Morita, Mitaka-shi; Takahide Ikeda, Kokubunji-shi; Shigeru Nishimatsu, Tokyo; Hisumi Sano, Tokyo; Masatada Horiuchi, Koganei-shi, all of Japan

[21] Appl. No. 860,303
[22] Filed Sept. 23, 1969
[45] Patented Sept. 21, 1971
[73] Assignee Hitachi, Ltd.
Tokyo, Japan
[32] Priority Sept. 30, 1968
[33] Japan
[31] 43/70131

[54] METHOD OF FORMING A JUNCTION BY ION IMPLANTATION
10 Claims, 14 Drawing Figs.

[52] U.S. Cl. ........ 148/1.5, 29/576, 148/186, 148/188
[51] Int. Cl. ........ H01l 7/54
[50] Field of Search ........ 29/576; 148/1.5, 186, 188

[56] References Cited
UNITED STATES PATENTS
3,328,210 6/1967 McCaldin et al. ........ 148/1.5
3,489,622 1/1970 Barson et al. ........ 148/187

*Primary Examiner*—L. Dewayne Rutledge
*Assistant Examiner*—R. A. Lester
*Attorney*—Craig, Antonelli, Stewart & Hill

ABSTRACT: Disclosed is a method of forming a PN junction comprising the steps of implanting impurity ions into an insulating layer formed on the surface of a semiconductor substrate and then diffusing the implanted impurity ions into the surface layer of the semiconductor substrate thereunder.

METHOD OF FORMING A JUNCTION BY ION IMPLANTATION

BACKGROUND OF THE INVENTION

1. Field of the Invention

This invention relates to a method of forming a junction in the surface portion of a semiconductor substrate by ion implantation and more particularly to a method of forming a junction of predetermined dimensions in the surface portion of a semiconductor substrate.

2. Description of the Prior Art

Recently, the so-called ion implantation method, which is a method of forming a PN junction in a semiconductor substrate by ionizing impurity atoms which may become acceptors or donors such as boron or phosphorus, then accelerating these ions with high voltage and implanting then into a semiconductor substrate, has become an object of public attention. This method has such advantage that either an abrupt PN junction, an $NN^+$ junction or a $PP^+$ junction can be easily formed by the control of the accelerating voltage, that a thin PN junction necessary for a diode or transistor for high frequency use or for an integrated circuit can be easily made and that a junction can be made by implanting impurities at a relatively low temperature.

For the manufacture of a PN, $NN^+$ or $PP^+$ junction in a semiconductor body by ion implantation, either of the following two methods is conventionally employed.

The first method uses a metal mask of a desired pattern. As is shown in FIG. 1, a metal mask 3 having a slit 2 of the desired size is provided over a semiconductor substrate 1 of N-type silicon monocrystal. An ion beam 4 of P-type impurity, such as boron, is irradiated onto the substrate 1 through the metal mask with high energy to implant the impurity ions 4 into a desired portion of the substrate 1 thereby to form a P-type layer 5 and a PN junction 6 therearound the shape of which is determined by the shape of the slit.

The second method employs the photoetching technique of an insulating film. Namely, a silicon oxide film 7 is formed on a semiconductor substrate 1 by oxidation at high temperature or thermal decomposition of monosilane and a predetermined portion 8 of the oxide film is removed by the photoetching technique to expose a desired portion of the semiconductor substrate, as is shown in FIG. 2. Then, P-type impurity ions 4 are irradiated onto the substrate 1 to form a P-type region 5 in the portion not covered with the oxide film and a PN junction 6 therearound.

The silicone oxide film is provided for preventing the irradiated ions from reaching the substrate. Therefore, the thickness of the oxide film should be selected in such a manner that the irradiated ions 4 penetrate the oxide film only to an intermediate position as shown by dotted line 9 in FIG. 3.

In both methods, however, the surface of a semiconductor substrate is irradiated with ions of high energy which is needed to implant them directly into the substrate surface. Thus, a considerable number of crystal disturbances and lattice defects are formed in the substrate portion irradiated by the ion beam. Lattice defects formed in the substrate seriously affect the electrical characteristics of a PN junction formed by the ion implantation, and especially deteriorate the rectifying function of the PN junction and cause variations with time in the electrical characteristic of the PN junction.

In order to remove lattice defects formed by ion implantation, a semiconductor substrate is usually heated to temperature of 600° to 800° C. and then afterwards annealed. But annealing cannot completely remove the lattice defects formed in the substrate and the electrical characteristics of a PN junction thus obtained are inferior to those of a PN junction formed by the thermal diffusion of impurities which is the usual manufacturing process of a PN junction.

Therefore, the ion implantation method has not been brought into practical use for these reasons, while having fair advantage.

SUMMARY OF THE INVENTION

An object of this invention is to provide an improved method of forming a PN, NN or PP junction of excellent electrical characteristics.

Another object of this invention is to provide a method of accurately and easily controlling the diffusion concentration of impurities in a semiconductor substrate.

A further object of this invention is to provide a method of forming a PN junction employing ion implantation which causes on lattice defects in a semiconductor substrate.

According to the feature of this invention to achieve the above objects, first a thin layer of such insulating material that will not become an active impurity in the semiconductor body to be used nor react with it at a high temperature is formed on a semiconductor substrate, then an ion beam which will become an active impurity for the semiconductor body is implanted into but not through said thin layer and finally the semiconductor substrate is heated to diffuse the impurity stored in the thin layer by the ion implantation into said semiconductor substrate through said thin layer.

The purposes and features of the present invention will become more apparent from the following description taken in conjunction with the accompanying drawings.

DESCRIPTION OF THE PREFERRED EMBODIMENTS

EXAMPLE 1

Figure 1:
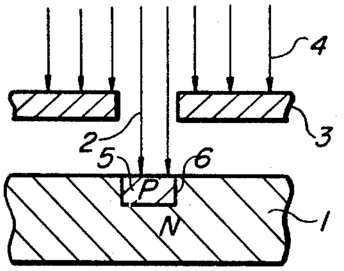
FIG. 1 PRIOR ART
FIG. 1 illustrates a conventional ion implantation method using a metal mask.
Figure 2:
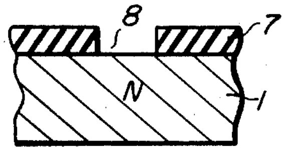
FIG. 2 PRIOR ART
FIGS. 2 and 3 illustrate steps of another conventional ion implantation method using an oxide film.
Figure 3:
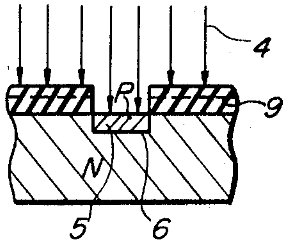
FIG. 3 PRIOR ART
Figure 4:
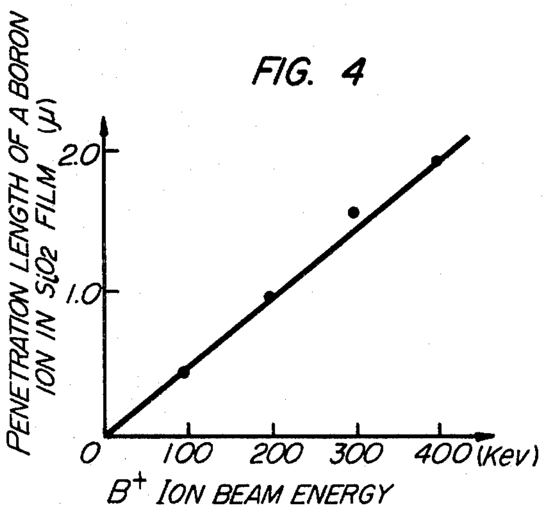
FIG. 4 is a plot-diagram of the penetration length of boron ions into a silicon oxide layer with respect to their energy.

FIG. 4 shows the relationship of the penetration length of a boron ion in a silicon oxide film and its energy in the ion-implanting process. Boron ions will be introduced into a semiconductor substrate based on an analysis of this relationship.

Figure 5:
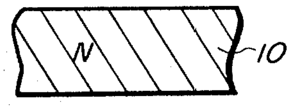
FIGS. 5 to 8 illustrate, in cross section, various steps of a method of forming a PN junction according to the invention.
Figure 6:
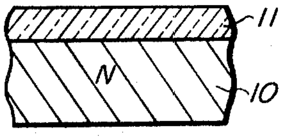

First, a silicon oxide film 11 is formed on the surface of an N-type silicon substrate 10, as is shown in FIGS. 5 and 6, by some known process such as oxidation at high temperature or oxidation of monosilane.

Figure 7:
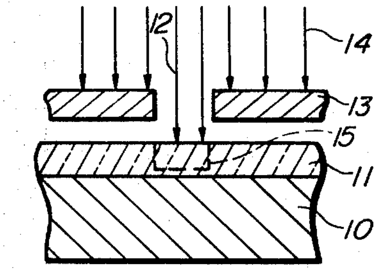
Figure 8:
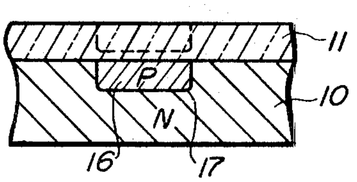

Then, a metal mask 13 with a slit 12 is brought to a predetermined position over the semiconductor substrate 10 as is shown in FIG. 7. An ion beam 14 of P-type active impurity such as boron is implanted into the silicon oxide film 11 formed on the substrate 10 to a depth indicated at a dotted line 15 in FIG. 7 by some known means (not shown) such as high frequency ion source, electron-collision-type ion source, or duoplasmatron ion source under the control of its accelerating voltage. Here, the energy of the ion beam which determines the penetration length in the oxide film is determined based on the analysis of plots of FIG. 4. Next, the semiconductor substrate 10 is heated to about 1,000° C. in a conventional heat treatment furnace thereby to diffuse boron ions stored in the oxide film into the surface portion of the semiconductor substrate. The diffused boron ions form a P-type region 16 surrounded with a PN junction 17 as is shown in FIG. 8. The depth of the PN junction 17 is a function of the quantity of boron ions stored in the oxide film and the duration of the heat treatment.

The P-type region 16 is not formed by implantation of high energy ion but by thermal diffusion, therefore it has few crystal defects. The shape of the P-type region 16 naturally resembles the shape of the ion implantation in the oxide film.

The insulating film to be formed on the semiconductor substrate 10 is not necessarily silicon oxide, but also silicon nitride, alumina or the like which do not react with the semiconductor substrate around a temperature of 1,000° C. can be used.

EXAMPLE 2

A metal mask is used in example 1 to limit the area of ion implantation. But the area of a PN junction to be formed in a transistor for high frequency use or in an integrated circuit may be too small to use a metal mask. To avoid the difficulty in manufacturing of a metal mask with a slit of minute dimensions, an insulating film with a varying thickness is used in this example to enhance the manufacture of a minute junction for a diode or transistor for high frequency use or for an integrated circuit or large-scale integrated circuit, etc.

Figure 9:
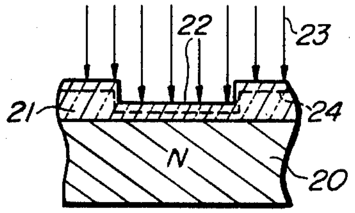
FIGS. 9 and 10 illustrate in cross section steps of another method of the invention.
Figure 10:
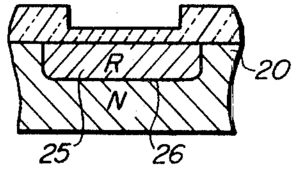

Referring to FIGS. 9 and 10, a silicon oxide film 21 is first formed on one principal surface of a semiconductor substrate 20 of N-type silicon single crystal by a conventional method. Then, a predetermined portion 22 of the oxide film 21 is removed to some extent by photoetching to form a recess 22 in the oxide film. The silicone oxide film remains under the recess 22 but has a smaller thickness thereat. Then, an ion beam 23 of P-type impurity such as boron is irradiated onto the whole surface of the oxide film to a depth indicated by a dotted line 24 by ion irradiation means (not shown). Then, the semiconductor substrate 20 is heated to a temperature of around 1,000° C. to diffuse the impurity ions stored in that part of the oxide film which has a smaller thickness into the semiconductor substrate 2. The heating is stopped before the impurity ions stored in the oxide film with a larger thickness diffuse into the substrate. By these procedures, a P-type region 25 is selectively formed in the semiconductor substrate 20 with a PN junction 26 therearound.

The employment of a photoetching technique in this example enhances the minute treatment of a PN junction and can provide a very thin diffused region since the oxide film in the recess portion is made so thin.

EXAMPLE 3

Figure 11:
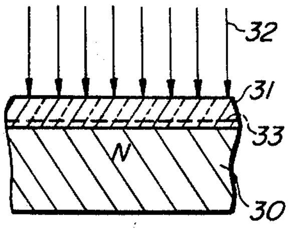
FIGS. 11 to 13 illustrate in cross section steps of a further method of the invention.
Figure 12:
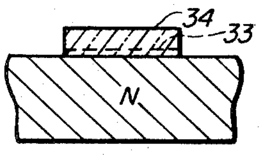
Figure 13:
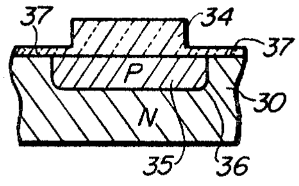

A silicon oxide film 31 is formed on one principal surface of a semiconductor substrate 30 and then a beam 32 of boron ions is irradiated onto the whole surface of the oxide film 31 to penetrate into the oxide film to an intermediate position indicated by a dotted line 33 as is shown in FIG. 11. The silicon oxide film is selectively etched away to leave a predetermined portion 34, as is shown in FIG. 12. Then, the semiconductor substrate 30 is heated to a temperature of around 1,000° C. in an atmosphere including oxygen or water vapor to diffuse the impurity ions stored in the oxide film 34 into the substrate to form a P-type region 35 with a PN junction 36 as is shown in FIG. 13. In this process, a new oxide film 37 is formed by the oxidation of the substrate.

Since unnecessary portions of the silicon oxide film are completely etched away in this example, there is no fear that a false diffusion occurs from an unnecessary portion of the oxide film as may happen in example 2. The shape of the P-type region 35 resembles the shape of the remaining oxide film 34.

EXAMPLE 4

Figure 14:
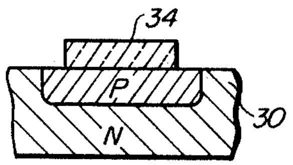
FIG. 14 illustrates yet another method of the invention.

This example is the same as example 3 except that a substrate is heated in an inert atmosphere. Thus, no further oxide film is formed on the substrate 30 as is shown in FIG. 14.

The present method has been described hereinabove with the combination of an N-type silicon substrate, a silicone oxide film if any, and boron ions. However this combination is not a limitative one but can be changed in various ways. For example, a semiconductor substrate may be formed of Ge, GaAs, InSb, InAs, GaP, InP, CdS, CdSe, ZnSe, ZnTe, or the like as well as Si. Further, if an N- (or P)-type impurity is used for an N-(or P) -type semiconductor substrate, an $NN^+$ (or $PP^+$) junction will be formed. A P-type impurity may be B, Al, In, etc. for Si or Ge and Zn, Cd, etc. for III–V group compound semiconductor. An N-type impurity may be P, As, Sb, etc. for Si or Ge and Te, Se, S, etc. for III–V group compound semiconductor.

As is clear from the foregoing description, the present method has the following advantages.

1. Since an impurity ion beam is implanted from an ion source into an oxide film, the quantity of the impurity is readily measurable from the ionic current and the diffusion concentration into the semiconductor substrate can be easily and accurately controlled. Thus, low concentration diffusion and shallow diffusion are made possible.

2. The very impurity to be used can be introduced into an oxide film formed on a semiconductor substrate in the form of ion beam, the PN junction to be formed thereafter by thermal diffusion has a precise shape and good electrical characteristics.

3. Further, as the ion beam of the impurity is not directly implanted into a semiconductor substrate, lattice defects or crystal disturbance does not occur. Thus, annealing for removing defects and disturbance is unnecessary.

4. When a semiconductor substrate is heated with its whole surface covered with a silicon oxide film, impurities other than the desired one are prevented from going into the substrate and also stress due to the reaction of silicon oxide is less compared with the case of using a partial silicon oxide film.

5. A silicon oxide film with impurities therein can be formed at a normal temperature.

6. By the combination or repetition of the inventive method, semiconductor devices such as diodes, transistors and integrated circuits can be easily made.

We claim:

1. A method of forming a junction by ion implantation comprising the steps of:
   a. forming an insulating layer on a surface a semiconductor substrate of a first conductivity type;
   b. implanting impurity ions into a predetermined portion of said insulating layer, the impurity ions determining a second conductivity type when transferred into the semiconductor substrate; and
   c. heating the thus processed semiconductor substrate to cause the diffusion of the impurity stored in the insulating layer into the surface portion of the semiconductor substrate to thereby form a second conductivity-type region in the substrate with a junction therebetween.

2. A method according to claim 1, wherein said first conductivity type is an opposite type to said second conductivity type.

3. A method according to claim 1, wherein said insulating layer is formed of a material selected from the group consisting of silicon oxide, aluminum oxide and silicon nitride.

4. A method of forming a junction by ion implantation comprising the steps of:
   a. forming an insulating layer on a surface of a semiconductor substrate of a first conductivity type;
   b. forming a recessed portion in said insulating layer;
   c. implanting impurity ions into the whole surface of said insulating layer, the impurity ions determining a second conductivity type when transferred into the semiconductor substrate; and
   d. heating the semiconductor substrate thus processed to cause the diffusion of the impurity stored in the recessed portion of the insulating film into surface portion of the semiconductor substrate to thereby form a second conductivity-type region in the substrate with a PN junction therebetween.

5. A method according to claim 4, wherein said first conductivity type is an opposite type to said second conductivity type.

6. A method according to claim 4, wherein said insulating layer is formed of a material selected from the group consisting of silicon oxide, aluminum oxide and silicone nitride.

7. A method of forming a junction by ion implantation comprising the steps of:

a. forming an insulating layer on a surface of a semiconductor substrate of a first conductivity type;
b. implanting impurity ions into the surface portion of the insulating layer, the impurity ions determining a second conductivity type when transferred into the semiconductor substrate;
c. removing said insulating layer except a predetermined portion; and
d. heating the semiconductor substrate thus processed to cause diffusion of the impurity stored in the insulating layer into the surface portion of the semiconductor substrate to thereby form a second conductivity-type region in the substrate with a junction therebetween.

8. A method according to claim 7, wherein said heating step is done in an oxidizing atmosphere.

9. A method according to claim 7, wherein said insulating layer is formed of a material selected from the group consisting of silicon oxide, aluminum oxide and silicon nitride.

10. A method according to claim 7, wherein said first conductivity type is an opposite type to said second conductivity type.